US009698511B2

(12) United States Patent
Oda

(10) Patent No.: US 9,698,511 B2
(45) Date of Patent: Jul. 4, 2017

(54) ELECTRIC CONTACT AND SOCKET FOR ELECTRICAL PART

(71) Applicant: ENPLAS CORPORATION, Kawaguchi-shi, Saitama (JP)

(72) Inventor: Takahiro Oda, Kawaguchi (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 14/384,033

(22) PCT Filed: Dec. 27, 2012

(86) PCT No.: PCT/JP2012/083910
§ 371 (c)(1),
(2) Date: Sep. 9, 2014

(87) PCT Pub. No.: WO2013/140699
PCT Pub. Date: Sep. 26, 2013

(65) Prior Publication Data

US 2015/0079858 A1 Mar. 19, 2015

(30) Foreign Application Priority Data

Mar. 21, 2012 (JP) ................................ 2012-063256

(51) Int. Cl.
*H01R 13/24* (2006.01)
*H01R 13/03* (2006.01)
(Continued)

(52) U.S. Cl.
CPC ......... *H01R 13/03* (2013.01); *B23K 35/3013* (2013.01); *B32B 15/01* (2013.01);
(Continued)

(58) Field of Classification Search
CPC ..................................................... H01R 13/03
(Continued)

(56) References Cited

U.S. PATENT DOCUMENTS 2,897,584 A 8/1959 Schumpelt
5,438,175 A * 8/1995 Herklotz ............... H01H 1/023 200/269

(Continued)

FOREIGN PATENT DOCUMENTS

EP 0 274 012 A2 7/1988
JP 2003-293187 10/2003

(Continued)

OTHER PUBLICATIONS

International Search Report mailed Apr. 9, 2013, in corresponding International Patent Application No. PCT/JP2012/083910.

(Continued)

*Primary Examiner* — Tulsidas C Patel
*Assistant Examiner* — Marcus Harcum
(74) *Attorney, Agent, or Firm* — Staas & Halsey LLP

(57) ABSTRACT

An electric contact for preventing a terminal of an electrical part and the electric contact from sticking to each other after a continuity test to improve the durability of the electric contact; and a socket for electrical part using the electric contact. In the electric contact according to the preferred embodiment of the present invention, a foundation layer composed primarily of Ni, a surface layer composed primarily of Pd and Ag, and an outermost layer composed primarily of Sn or Au are formed on a surface of an electrically-conductive base material.

14 Claims, 22 Drawing Sheets

(51) Int. Cl.

| | |
|---|---|
| ***C25D 5/12*** | (2006.01) |
| ***C25D 7/00*** | (2006.01) |
| ***C22C 5/04*** | (2006.01) |
| ***C22C 5/06*** | (2006.01) |
| ***C22C 13/00*** | (2006.01) |
| ***B32B 15/01*** | (2006.01) |
| ***C22C 9/04*** | (2006.01) |
| ***C22C 19/03*** | (2006.01) |
| ***B23K 35/30*** | (2006.01) |
| ***G01R 1/067*** | (2006.01) |
| *B23K 35/26* | (2006.01) |
| *C22C 32/00* | (2006.01) |

(52) U.S. Cl.

CPC .............. *B32B 15/018* (2013.01); *C22C 5/04* (2013.01); *C22C 5/06* (2013.01); *C22C 9/04* (2013.01); *C22C 13/00* (2013.01); *C22C 19/03* (2013.01); *C25D 5/12* (2013.01); *C25D 7/00* (2013.01); *G01R 1/06761* (2013.01); *H01R 13/24* (2013.01); *H01R 13/2421* (2013.01); *B23K 35/262* (2013.01); *C22C 32/0021* (2013.01)

(58) Field of Classification Search

USPC .......................................... 439/886, 887, 931

See application file for complete search history.

(56) References Cited

U.S. PATENT DOCUMENTS

| | | | | |
|---|---|---|---|---|
| 6,770,383 | B2 * | 8/2004 | Tanaka | B32B 15/01 427/123 |
| 2005/0020116 | A1 * | 1/2005 | Kawazoe | H01R 13/24 439/331 |
| 2005/0145997 | A1 * | 7/2005 | Buresch | C23C 28/021 257/666 |
| 2006/0281363 | A1 * | 12/2006 | Trezza | H01L 21/76898 439/502 |
| 2008/0139058 | A1 * | 6/2008 | Oda | C25D 5/12 439/887 |
| 2011/0294368 | A1 | 12/2011 | Nakata et al. | |

FOREIGN PATENT DOCUMENTS

| | | |
|---|---|---|
| JP | 2008-78032 | 4/2008 |
| WO | WO 2007/034921 A1 | 3/2007 |

OTHER PUBLICATIONS

Singapore Office Action issued Aug. 17, 2015 in corresponding Singapore Patent Application No. 11201405838W.

Singapore Written Opinion dated May 16, 2016 in corresponding Singapore Patent Application No. 11201405838W.

* cited by examiner

ELECTRIC CONTACT AND SOCKET FOR ELECTRICAL PART

CROSS-REFERENCE TO RELATED APPLICATIONS

This application is a U.S. National Stage Application under 35 U.S.C. 371 of International Patent Application No. PCT/JP2012/083910, filed Dec. 27, 2012, which is based on and claims foreign priority benefit of Japanese Patent Application No. 2012-063256, filed Mar. 21, 2012, in the Japanese Patent Office, the entire disclosures of which are herein incorporated by reference as a part of this application.

BACKGROUND

1. Field

The present invention relates to an electric contact electrically connected to an electrical part such as a semiconductor device (hereinafter referred to as "IC package"), and a socket for electrical part in which this electric contact is disposed.

2. Description of Related Art

Conventionally, probe pins arranged in an IC socket for use as a socket for electrical part have been known as this type of electric contacts. This IC socket is disposed on a wiring board and configured to house an IC package, which is an inspection object. Terminals of this IC package are electrically connected to electrodes of the wiring board through the probe pins.

The probe pins have a structure in which a foundation layer and a surface layer are formed on a base material. On the other hand, some of the terminals of the IC package include a layer of so-called lead-free solder (i.e., solder composed primarily of tin and not containing lead) formed on surfaces of each terminal. In a continuity test or the like of the IC package, the surface layer of each probe pin and the lead-free solder layer of each IC package terminal are electrically connected to each other as the result of being brought into contact with each other (see, for example, Domestic Re-publication No. 2007/034921).

SUMMARY

In such a conventional probe pin as described above, however, a terminal of the IC package sticks to the probe pin in some cases when the IC package is detached from the IC socket after a continuity test is conducted. If the terminal of the IC package is unstuck under this condition, the leading end of the probe pin is liable to become damaged. Thus, there arises the problem of degrading the durability of the probe pin. This sticking is remarkable, in particular, after a continuity test is conducted at high temperature (for example, 150° C. or higher) and is, therefore, significantly problematic.

Hence, it is an object of the present invention to provide an electric contact (probe pin) and a socket for electrical part capable of preventing a terminal of an electrical part (IC package) and the electric contact from sticking to each other after a continuity test and thereby improving durability of the probe pin.

As the result of keen examination in order to achieve such an object, the inventors et al. of the present invention have found the following. That is, the inventors et al. have found that it is possible to prevent a terminal of an electrical part and an electric contact from sticking to each other by further disposing an outermost layer composed of a specific material on a surface layer of the electric contact which is stick to the terminal of the electrical part.

An electric contact according to the present invention includes an electrically-conductive base material; and an outermost layer composed primarily of Sn or Au formed on the base material.

In the present invention, a surface layer composed primarily of a material into which Sn melts and diffuses upon application of heat is preferably formed on the base material, and the outermost layer is preferably formed so as to have direct contact with a surface of the surface layer.

In the present invention, the surface layer is preferably composed primarily of Pd and Ag.

In the present invention, the Ag is preferably heavier in weight than the Pd.

In the present invention, the surface layer preferably includes a Pd—Ag plated layer.

In the present invention, the surface layer preferably includes a laminate of a Pd—Ag plated layer and an Ag plated layer or a laminate of a Pd—Ag plated layer and a Pd plated layer.

In the present invention, the surface layer preferably includes a laminate of an Ag plated layer and a Pd plated layer.

In the present invention, a foundation layer composed primarily of Ni is preferably formed on the base material, and the surface layer is preferably formed on the foundation layer.

A socket for electrical part according to the present invention includes a socket body; a housing portion in which an electrical part provided with Sn-containing terminals is housed; and electric contacts according to the present invention disposed in the socket body and brought into contact with the terminals.

According to the present invention, since electric contacts including a base material composed of an electrically-conductive material and an outermost layer made of an Sn or Au material are adopted, it is possible to prevent terminals of an electrical part and electric contacts from sticking to each other after a continuity test and thereby improve the durability of a socket for electrical part.

BRIEF DESCRIPTION OF DRAWINGS

The invention will be explained in greater detail below with reference to exemplary embodiments in conjunction with the figures in the drawing, in which.

DESCRIPTION OF EMBODIMENTS

Hereinafter, embodiments of the present invention will be described.

Embodiment 1

FIGS. 1 to 5 illustrate Embodiment 1 of the present invention.

Figure 1:
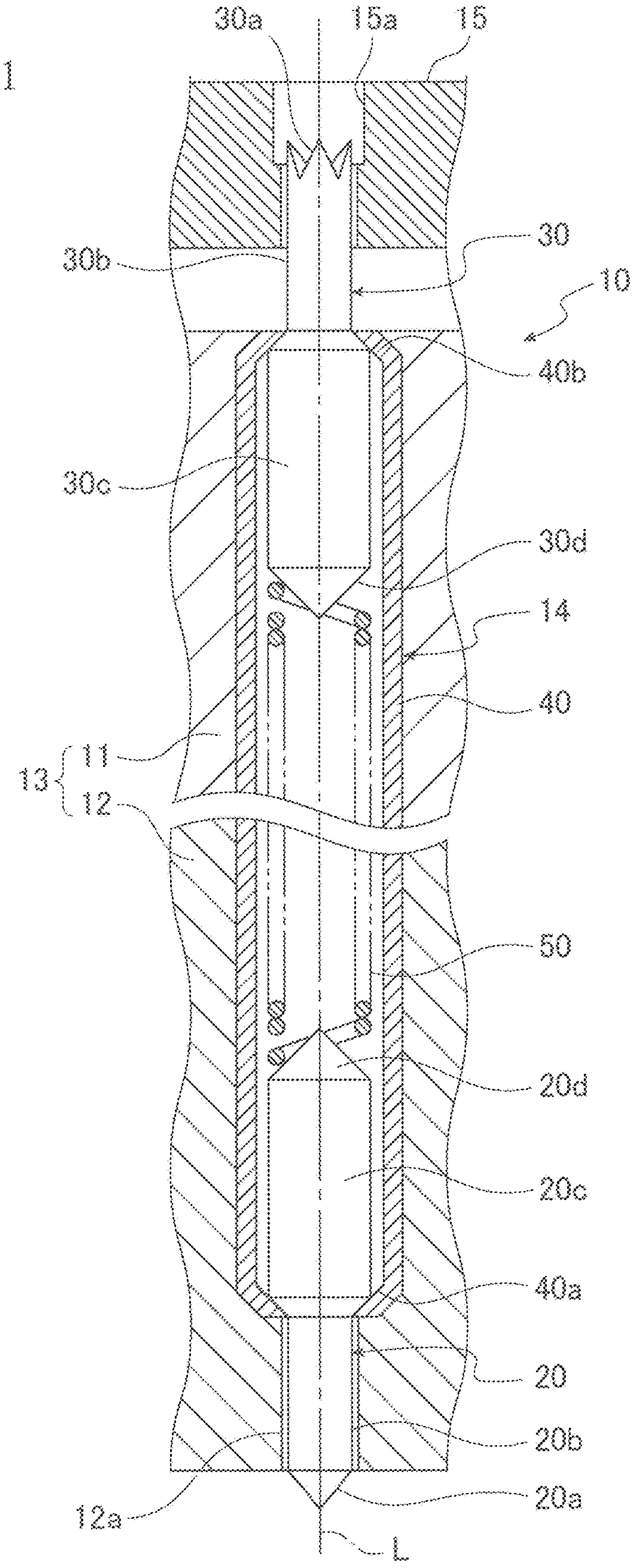
FIG. 1 is an enlarged cross-sectional view of the vicinity of a probe pin in an IC socket according to Embodiment 1 of the present invention.
Figure 2:
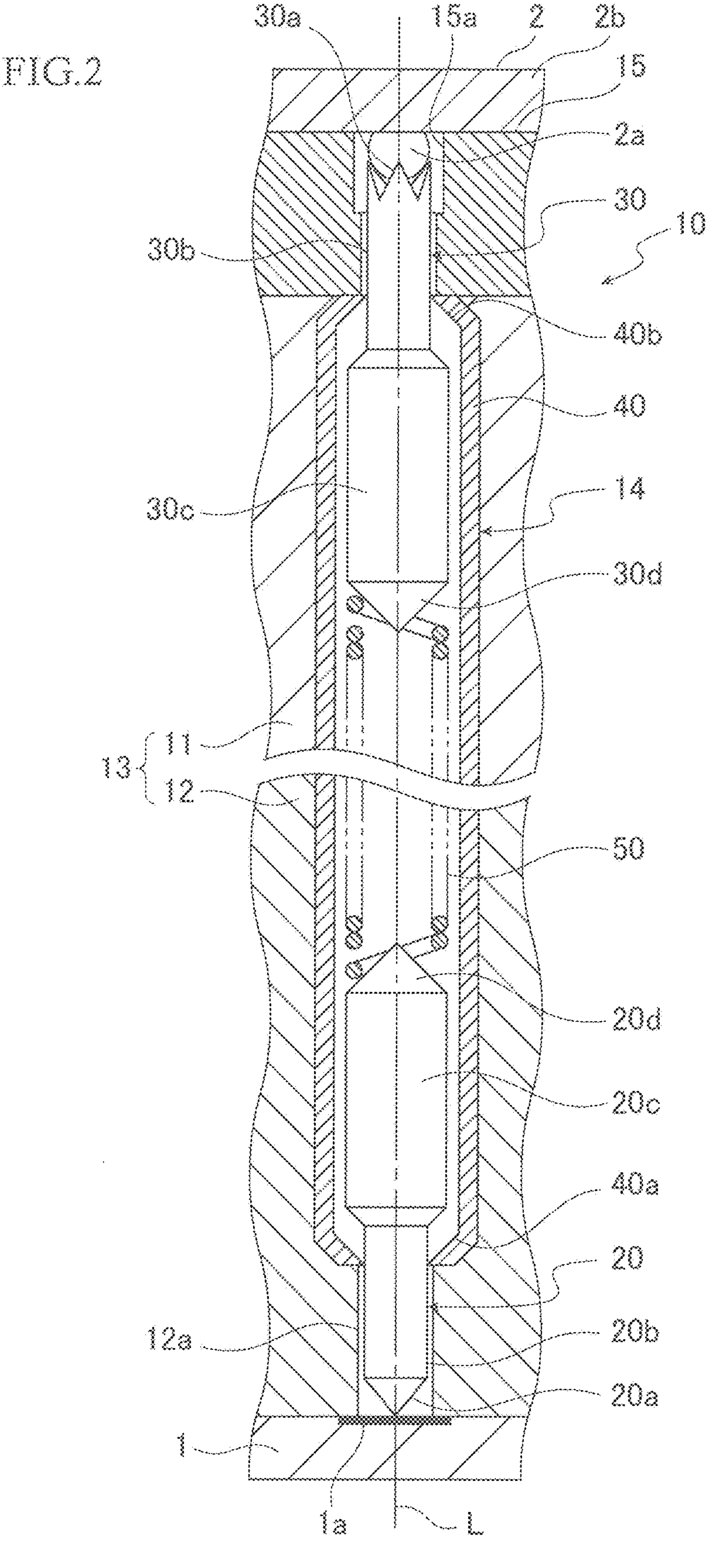
FIG. 2 is an enlarged cross-sectional view illustrating a state of an IC package and a wiring board being attached to the IC socket of FIG. 1.

An IC socket 10 of this Embodiment 1 (corresponding to "socket for electrical part" of the present invention) is fixed on a wiring board 1, as illustrated in FIGS. 1 and 2. An IC package 2 (corresponding to "electrical part" of the present invention) is attached to the upper portion of the IC socket 10. When the IC package 2 is attached, an electrode 1*a* of the wiring board 1 and a solder ball 2*a* of the IC package 2 serving as a terminal are electrically connected to each other. The IC socket 10 is used in testing equipment or the like for a continuity test, such as a burn-in test, on the IC package 2, for example.

In the IC package 2 of this Embodiment 1, a plurality of solder balls 2*a* is disposed on the bottom surface of a substantially rectangular package body 2*b*. These solder balls 2*a* are formed from so-called lead-free solder (i.e., solder composed primarily of Sn and not containing lead).

The IC socket 10 is provided with a socket body 13 comprising an upper plate 11 and a lower plate 12. In addition, the IC socket 10 is provided with a plurality of probe pins 14 serving as electric contacts disposed in this socket body 13 into a matrix-like shape, so as to penetrate through the socket body 13 in the longitudinal direction thereof. The socket body 13 is positioned in place on the wiring board 1 by a positioning pin (not illustrated) with the upper plate 11 and the lower plate 12 fixed with fixing screws (not illustrated). Note that a floating plate 15 (corresponding to "housing portion" of the present invention) movable upward and downward with the IC package 2 housed is disposed on the upper plate 11.

In this Embodiment 1, the layout pitch of the solder balls 2*a* disposed on the IC package 2 is the same as the layout pitch of the electrodes 1*a* disposed on the wiring board 1 and electrically connected to the solder balls 2*a*. The layout pitch of the probe pins 14 is also the same as these layout pitches.

As illustrated in FIGS. 1 and 2, each probe pin 14 includes a first plunger 20, a second plunger 30, and a cylindrical member 40 disposed along a lengthwise axis line L. A contacting portion 20*a* to have electrical contact with the electrode 1*a* of the wiring board 1 is formed at the leading end of the first plunger 20. A contacting portion 30*a* to have electrical contact with the solder ball 2*a* of the IC package 2 is formed at the leading end of the second plunger 30. The cylindrical member 40 is disposed between the first plunger 20 and the second plunger 30. A coil spring 50 for urging the first plunger 20 and the second plunger 30 in directions in which the plungers move away from each other along the axis line L is housed inside this cylindrical member 40.

The first plunger 20 is provided with a protruding portion 20*b* at the leading end of which the substantially conical contacting portion 20*a* to have contact with the electrode 1*a* of the wiring board 1 is disposed; and an insertion portion 20*c* thicker than the protruding portion 20*b*. The insertion portion 20*c* of these portions is slidably housed inside the cylindrical member 40 in a state of having contact therewith. The movement of the first plunger 20 in the projecting direction (downward direction) thereof is restricted by a locking part 40*a* formed at the lower end of the cylindrical member 40. In addition, a receiving portion 20*d* for stopping the coil spring 50 is formed into a conical shape with the axis line L in the center at an end of the insertion portion 20*c* and integrally therewith. Yet additionally, the protruding portion 20*b* is slidably inserted through a through-hole 12*a* of the lower plate 12.

The second plunger 30 is provided with a protruding portion 30*b* at the leading end of which a substantially crown-shaped contacting portion 30*a* to have contact with the solder ball 2*a* of the IC package 2 is disposed; and an insertion portion 30*c* thicker than the protruding portion 30*b*. The insertion portion 30*c* of these portions is housed inside the cylindrical member 40 in a state of slidably having contact with the inner side surface of the cylindrical member 40. The movement of the second plunger 30 in the projecting direction (upward direction) thereof is restricted by a locking part 40*b* formed at the upper end of the cylindrical member 40. In addition, a receiving portion 30*d* for stopping the coil spring 50 is formed into a conical shape with the axis line L in the center at the lower end of the insertion portion 30*c* and integrally therewith. Yet additionally, the protruding portion 30*b* projects out of the upper plate 11. A contacting portion 30*a* is disposed at the upper end of this protruding portion 30*b*. This contacting portion 30*a* is slidably inserted through a through-hole 15*a* of the floating plate 15 capable of housing the solder ball 2*a* of the IC package 2.

Next, the material of the probe pin 14 in this Embodiment 1 will be described using FIGS. 3 to 5. Note that a description will be made of the material of the second plunger 30 of the probe pin 14 in particular here.

Figure 3:
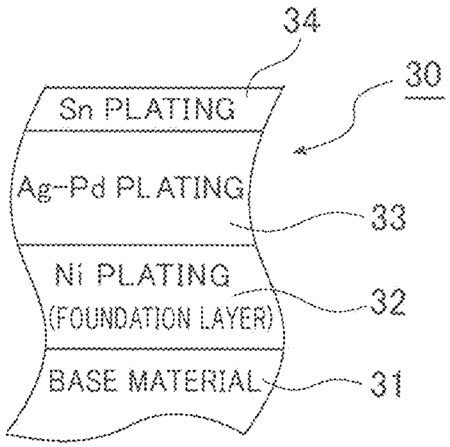
FIG. 3 is a schematic cross-sectional view illustrating the laminar structure of the contacting portion of the probe pin according to Embodiment 1.

As illustrated in FIG. 3, the second plunger 30 of the probe pin 14 in this Embodiment 1 has a structure in which a base material 31, a foundation layer 32, a surface layer 33, and an outermost layer 34 are laminated.

Among the material and the layers, the base material 31 has electrical conductivity and is formed from, for example, brass.

As the foundation layer 32, it is possible to use, for example, a plated layer composed primarily of Ni. The film thickness of the foundation layer 32 is, for example, 2 to 3 μm.

As a primary constituent, the surface layer 33 contains a material into which Sn melts upon application of heat. In this Embodiment 1, a Pd—Ag plated layer having a thickness of approximately 1 μm is adopted as the surface layer 33. Pd may be higher in weight ratio than Ag, or Ag may be higher in weight ratio than Pd. It is possible however to enhance the durability of the probe pin 14, compared with a conventional probe pin in which Au is plated on Ni, by making the ratio of Ag higher.

This Pd—Ag plated layer can be formed using, for example, a process of manufacture by wet plating or a process of manufacture by ion plating.

In the process of manufacture by wet plating, the foundation layer 32 (for example, an Ni plated layer having a thickness of 2 to 3 μm) is formed first, and then an adhesion layer (for example, an Au strike-plated layer) is formed on the foundation layer 32. Then, a Pd plated layer having a thickness of 0.5 μm and an Ag plated layer having a thickness of 0.5 μm, for example, are laminated in an alternate manner. Thereafter, Pd and Ag are thermally diffused at predetermined temperature using a thermostatic chamber to form the surface layer 33. The weight ratio between Pd and Ag at this time is, for example, Pd:Ag=54:46. This ratio may be freely varied by adjusting the film thicknesses of the Pd plated layer and the Ag plated layer.

On the other hand, in the process of manufacture by ion plating, the foundation layer 32 (for example, an Ni plated layer having a thickness of 2 to 3 μm) is formed first. Then, Pd and Ag are deposited on the foundation layer 32 by ion plating, so as to have a thickness of, for example, 1 μm, thereby forming the surface layer 33. In this case, the weight ratio between Pd and Ag is Pd:Ag=36:64, Ag being higher in weight ratio than Pd.

The outermost layer 34 is a layer used to prevent the solder ball 2*a* of the IC package 2 and the second plunger 30 of the probe pin 14 from sticking to each other at the time of continuity test. In this Embodiment 1, an Sn plated layer having a thickness of approximately 0.3 μm is used as the outermost layer 34. This outermost layer 34 is formed on the surface layer 33. The outermost layer 34 can be formed by means of wet plating or ion plating in the same way as the abovementioned surface layer 33.

When the IC socket 10 according to this Embodiment 1 (i.e., an IC socket 10 in which the second plunger 30 of the probe pin 14 is configured as described above) is used, a plurality of probe pins 14 is first plugged into the socket body 13. In addition, the IC socket 10 is disposed with the contacting portion 20*a* of the first plunger 20 projecting downward and the contacting portion 30*a* of the second plunger 30 facing the through-hole 15*a* of the floating plate 15, as illustrated in FIG. 1. Then, this IC socket 10 is positioned and fixed on the wiring board 1, and the contacting portion 20*a* of the first plunger 20 is brought into contact with the electrode 1*a* of the wiring board 1, as illustrated in FIG. 2. At this time, the coil spring 50 is compressed by the receiving portion 20*d* of the insertion portion 20*c* of the first plunger 20 inside the cylindrical member 40.

Thereafter, the IC package 2 is housed in the floating plate 15, and the solder ball 2*a* is fitted in the through-hole 15*a*. When the floating plate 15 is brought down under that condition, the contacting portion 30*a* of the second plunger 30 comes into contact with the solder ball 2*a*. If the floating plate 15 is brought down further, the coil spring 50 is compressed by the receiving portion 30*d* of the second plunger 30 inside the cylindrical member 40, as illustrated in FIG. 2.

The coil spring 50 is compressed by the first plunger 20 and the second plunger 30 in this way to urge the contacting portion 20*a* of the first plunger 20 and the contacting portion 30*a* of the second plunger 30 by the coil spring 50 in directions in which the contacting portions move away from each other. Thus, it is possible to bring the electrode 1*a* of the wiring board 1 and the solder ball 2*a* of the IC package 2 into contact with each other. Then, a continuity test, such as a burn-in test, is conducted on the IC package 2 under such a condition.

In a conventional IC socket, the solder ball 2*a* of the IC package 2 and the second plunger 30 of the probe pin 14 stick to each other in such a continuity test when the IC package 2 is detached from the IC socket 10 after the continuity test. In contrast, the IC socket of this Embodiment 1 can prevent the solder ball 2*a* and the second plunger 30 from sticking to each other and thereby improve the durability of the probe pin 14 and the IC socket 10. Hereinafter, the reason for this will be described in detail.

In the conventional IC socket, the Pd—Ag plated surface layer 33 is formed on the outermost side of the second plunger 30 formed in the probe pin 14. Accordingly, Sn in the solder ball 2*a* melts into the probe pin 14 when a continuity test is conducted on the IC package 2 including a terminal (solder ball 2*a*) formed from lead-free solder, thus forming a Pd—Ag—Sn alloy. As a result, there arises the problem in which the solder ball 2*a* and the probe pin 14 stick to each other through this Pd—Ag—Sn alloy after the continuity test. If an attempt is made to forcibly unstick the solder ball 2*a* and the probe pin 14 from each other under such a condition, a large amount of solder remains on the surface layer 33 of the probe pin 14. Consequently, the surface layer 33 of the probe pin 14 becomes damaged, thus degrading the durability of the probe pin 14.

In contrast, in this Embodiment 1, a plated layer serving as the outermost layer 34 and composed primarily of Sn is disposed on the probe pin 14, so as to have direct contact with a surface of the surface layer 33 (i.e., a plated layer composed primarily of Pd and Ag). Consequently, the probe pin 14 is in a state in which a specific amount of Sn in the outermost layer 34 has previously melted into a Pd—Ag alloy of the surface layer 33 prior to the continuity test. Accordingly, Sn in the solder ball 2*a* disposed on the IC package 2 is less likely to melt into the probe pin 14 even in a burn-in environment (for example, at a temperature of 125° C. to 180° C.). As a result, a Pd—Ag—Sn alloy is hardly formed between the solder ball 2*a* of the IC package 2 and the second plunger 30 of the probe pin 14. Accordingly, there does not arise the problem of the solder ball 2*a* and the probe pin 14 sticking to each other through this Pd—Ag—Sn alloy after a continuity test.

Thus, according to this Embodiment 1, a large amount of solder is less likely to remain on the surface layer 33 of the probe pin 14 after a continuity test. In addition, the surface layer 33 of the probe pin 14 is less likely to become damaged. Consequently, it is possible to improve the durability of the probe pin 14.

Next, a description will be made of evaluation tests that confirm the advantageous effects of the present invention.

Here, the amount of solder in the solder ball of the IC package formed into an alloy and stuck to the probe pin at the time of a high-temperature test was compared between a conventional probe pin (i.e., a probe pin provided with a second plunger including a surface layer composed of a Pd—Ag plated layer on the outermost side of the probe pin) and a probe pin of this Embodiment 1 (i.e., a probe pin provided with a second plunger in which an outermost layer composed primarily of Sn is plated on a surface layer composed primarily of Pd and Ag).

(1) Test Contents

First, a simultaneous high-temperature test was conducted using an IC socket including the probe pin according to this Embodiment 1 and an IC socket including a conventional probe pin (i.e., a probe pin not provided with an Sn plated layer serving as an outermost layer).

The specifications of the probe pins and the solder balls of IC packages used in this test were as follows:

(2) Specifications of Probe Pin Including Sn Plated Layer

Brass was used as a base material.

Like the contacting portion 30*a* illustrated in FIG. 1, the contacting portion of the probe pin was formed into a substantially crown-like shape.

A laminated film was formed on a surface of this contacting portion using wet plating.

That is, an Ni plated layer having a thickness of 2 to 3 μm was first formed on a surface of the base material. Then, an Au strike-plated layer to serve as an adhesion layer was formed on the Ni plated layer. In addition, a Pd plated layer having a thickness of 0.5 μm and an Ag plated layer having a thickness of 0.5 μm were laminated in an alternate manner. Thereafter, Pd and Ag were thermally diffused at predetermined temperature using a thermostatic chamber. The weight ratio between Pd and Ag at this time was Pd:Ag=54:46. Yet additionally, an Sn plated layer having a thickness of 0.3 μm was formed on the layer stack by a wet plating method.

(3) Specifications of Probe Pin not Including Sn Plated Layer

Brass was used as a base material.

Like the contacting portion 30*a* illustrated in FIG. 1, the contacting portion of the probe pin was formed into a substantially crown-like shape.

A laminated film was formed on a surface of this contacting portion using wet plating.

That is, an Ni plated layer having a thickness of 2 to 3 μm was first formed on a surface of the base material. Then, an Au strike-plated layer to serve as an adhesion layer was formed on the Ni plated layer. In addition, a Pd plated layer having a thickness of 0.5 μm and an Ag plated layer having a thickness of 0.5 μm were laminated in an alternate manner. Thereafter, Pd and Ag were thermally diffused at predetermined temperature using a thermostatic chamber. The weight ratio between Pd and Ag at this time was Pd:Ag=54:46.

(4) Specifications of Solder Balls of IC Package

Sn-3Ag-0.5Cu (percent by mass) lead-free solder was used as a material for forming the solder balls.

(5) Test Method

Method for measuring the amount of deposited solder: A shape measurement was conducted using a shape-measuring laser microscope (VK-9500 made by Keyence Corporation).

Test conditions were as follows:

Ambient temperature: Room temperature to 150° C.

Test time: 24 hours

A test procedure was as follows:

a. Attach the IC package to the IC socket.

b. Raise the temperature of the IC socket and the IC package up to 150° C.

c. Keep the temperature of the IC socket and the IC package at 150° C. for 24 hours.

d. Lower the temperature of the IC socket and the IC package down to room temperature.

e. Detach the IC package from the IC socket.

f. Measure the amount of solder deposited on the contacting portion of the probe pin.

(6) Test Results

The above-described test was conducted to analyze the contacting portion of each probe pin.

Figure 4A:
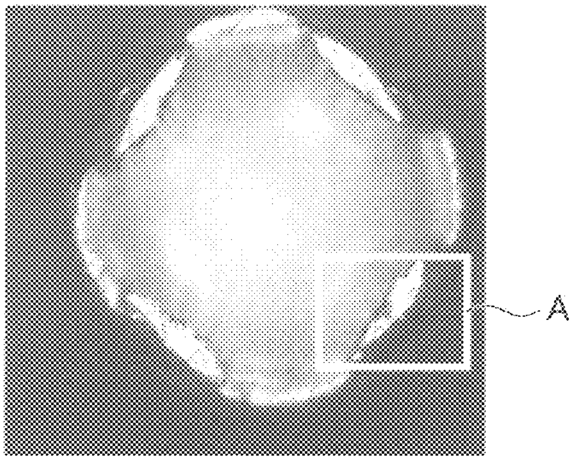
FIG. 4A is a photograph showing a state of the contacting portion of the probe pin according to Embodiment 1 after a high-temperature test.
Figure 4B:
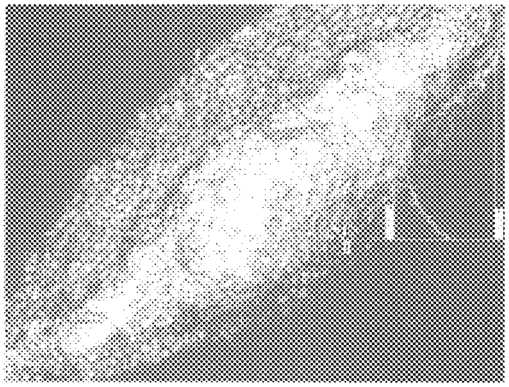
FIG. 4B is a partially-enlarged photograph of FIG. 4A.
Figure 4C:
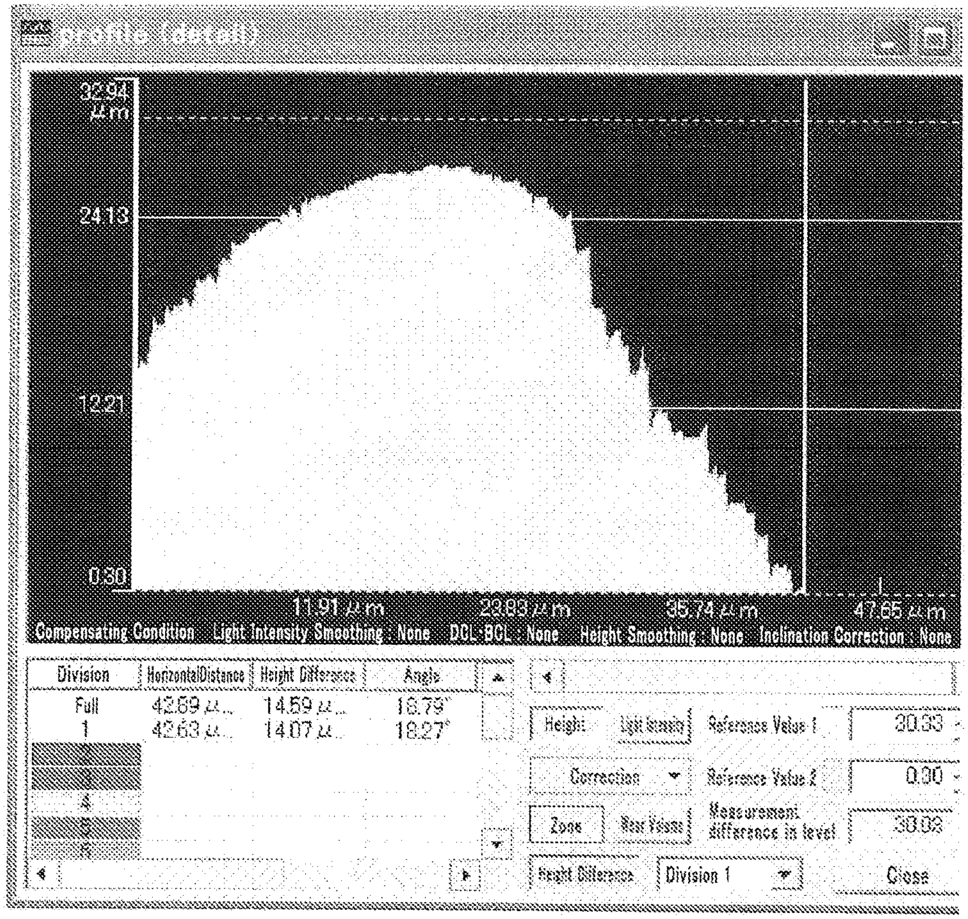
FIG. 4C is a photograph of a graph showing the result of measuring a cross-sectional shape corresponding to FIG. 4B.

FIG. 4A is a photograph showing a state of the probe pin including an Sn plated layer after the evaluation test. In FIG. 4A, white areas represent Sn that separated from the solder balls of the IC package and stuck to the surface of the probe pin. FIG. 4B is a partially-enlarged photograph of the region shown by reference character A in FIG. 4A. FIG. 4C is a photograph showing the result of measuring deposited Sn using the shape-measuring laser microscope, where the axis of abscissas represents the position, whereas the axis of ordinates represents the thickness.

Figure 5A:
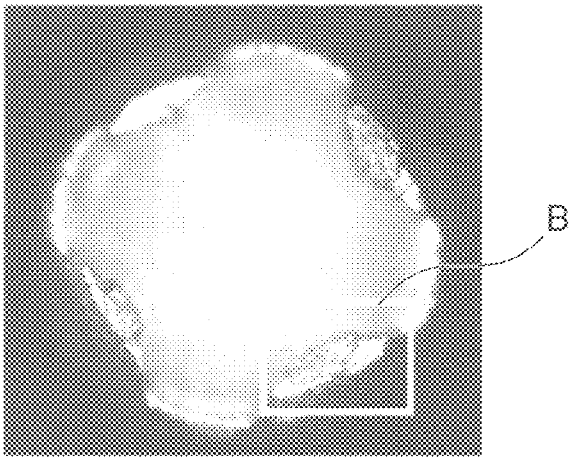
FIG. 5A is a photograph showing a state of the contacting portion of a probe pin according to a comparative example of Embodiment 1 after a high-temperature test.
Figure 5B:
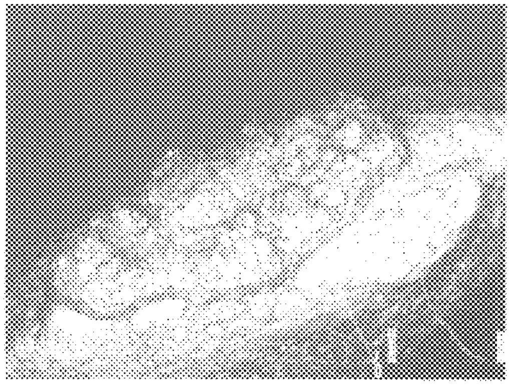
FIG. 5B is a partially-enlarged photograph of FIG. 5A.
Figure 5C:
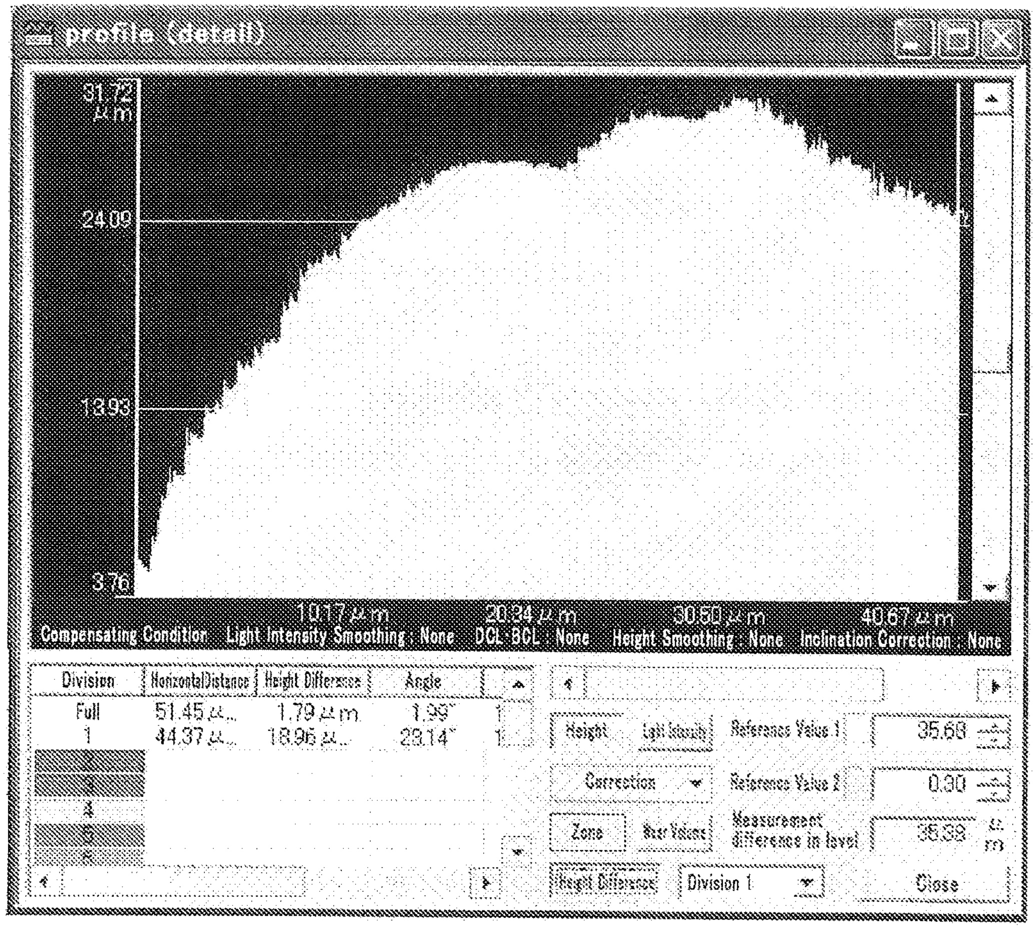
FIG. 5C is a photograph of a graph showing the result of measuring a cross-sectional shape corresponding to FIG. 5B.

FIG. 5A is a photograph showing a state of the probe pin not including an Sn plated layer after the evaluation test. In FIG. 5A, white areas represent Sn that separated from the solder balls of the IC package and stuck to the surface of the probe pin. FIG. 5B is a partially-enlarged photograph of the region shown by reference character B in FIG. 5A. FIG. 5C is a photograph showing the result of measuring the stuck Sn using the shape-measuring laser microscope, where the axis of abscissas represents the position, whereas the axis of ordinates represents the thickness.

As is understood from FIGS. 4A to 4C, the amount of solder sticking after the test is small in the probe pin according to this Embodiment 1 (i.e., a probe pin on which an Sn plated layer serving as an outermost layer is formed). Consequently, it can be said that the solder ball and the probe pin are less likely to stick to each other. In contrast, as is understood from FIGS. 5A to 5C, the amount of solder sticking after the test is large in the conventional probe pin (a probe pin on which an Sn plated layer is not formed), compared with the probe pin according to this Embodiment 1. Consequently, it can be said that the solder ball and the probe pin are more likely to stick to each other in the conventional probe pin.

Embodiment 2

Figure 6:
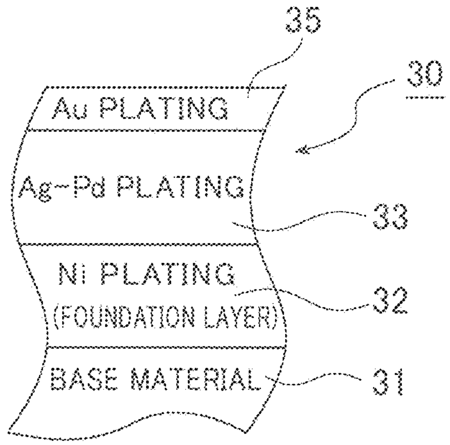
FIG. 6 is a schematic cross-sectional view illustrating the laminar structure of the contacting portion of a probe pin according to Embodiment 2 of the present invention.

FIGS. 6 to 8 illustrate Embodiment 2 of the present invention.

Note that Embodiment 2 of the present invention is the same as Embodiment 1 except the constituent elements to be discussed hereinafter, and therefore, constituent elements other than those different from the constituent elements of Embodiment 1 described above will be denoted by like reference numerals and characters and will be excluded from the discussion.

Hereinafter, the material of a probe pin 14 of this Embodiment 2 will be described using FIGS. 6 to 8. Note that the material of the second plunger 30 of the probe pin 14 will be described in particular here.

As illustrated in FIG. 6, the second plunger 30 of the probe pin 14 of this Embodiment 2 has a structure in which a base material 31, a foundation layer 32, a surface layer 33, and an outermost layer 35 are laminated.

Among the material and the layers, the base material 31, the foundation layer 32 and the surface layer 33 are the same as those of Embodiment 1 described above, and therefore, will not be discussed here.

The outermost layer 35 is a layer used to prevent the solder ball 2*a* of the IC package 2 and the second plunger 30 of the probe pin 14 from sticking to each other at the time of continuity test. In this Embodiment 2, an Au plated layer having a thickness of approximately 0.1 μm is used as the outermost layer 35. This outermost layer 35 is formed on the surface layer 33. The outermost layer 35 can be formed by means of wet plating or ion plating in the same way as the abovementioned surface layer 33.

The continuity test is conducted by bringing the probe pin 14 according to this Embodiment 2 (i.e., a probe pin 14 in which the second plunger 30 is structured as described above) into contact with the electrode 1*a* of the wiring board 1 and the solder ball 2*a* of the IC package 2. In this case, the solder ball 2*a* of the IC package 2 and the second plunger 30 of the probe pin 14 stick to each other in a conventional IC socket when the IC package 2 is detached from the IC socket 10 after the continuity test. In contrast, in the IC socket of this Embodiment 2, it is possible to prevent the solder ball 2*a* and the second plunger 30 from sticking to each other and thereby improve the durability of the probe pin 14 and the IC socket 10. Hereinafter, the reason for this will be described in detail.

In the conventional IC socket, the Pd—Ag plated surface layer 33 is formed on the outermost side of the second plunger 30 formed in the probe pin 14. Accordingly, Sn in the solder ball 2*a* melts into the probe pin 14 when a continuity test is conducted on the IC package 2 including a terminal (solder ball 2*a*) formed from lead-free solder, thus forming a Pd—Ag—Sn alloy. As a result, there arises the problem in which the solder ball 2*a* and the probe pin 14 stick to each other through this Pd—Ag—Sn alloy after the continuity test. If an attempt is made to forcibly unstick the solder ball 2*a* and the probe pin 14 from each other under such a condition, a large amount of solder remains on the surface layer 33 of the probe pin 14. Consequently, the surface layer 33 of the probe pin 14 becomes damaged, thus degrading the durability of the probe pin 14.

In contrast, in this Embodiment 2, a plated layer serving as the outermost layer 35 and composed primarily of Au is disposed on the probe pin 14, so as to have direct contact with a surface of the surface layer 33 (i.e., a plated layer composed primarily of Pd and Ag). Consequently, Sn in the solder ball 2*a* and Au in the outermost layer 35 form an Sn—Au alloy in a burn-in environment (at a temperature of, for example, 125° C. to 180° C.). This Sn—Au alloy has the nature of being brittle and easy to delaminate. As a result, the solder ball 2*a* and the probe pin 14 are easy to unstick from each other through this Sn—Au alloy after a continuity test. Accordingly, there does not arise the problem of the Pd—Ag alloy plated layer (i.e., the surface layer 33) underneath the outermost layer 35 forming a Pd—Ag—Sn alloy along with the solder ball 2*a* and sticking to the solder ball 2*a*.

Thus, according to this Embodiment 2, a large amount of solder is less likely to remain on the surface layer 33 of the probe pin 14 after a continuity test. In addition, the surface layer 33 of the probe pin 14 is less likely to become damaged. Consequently, it is possible to improve the durability of the probe pin 14.

Next, a description will be made of evaluation tests that confirm the advantageous effects of the present invention.

Here, the amount of solder in the solder ball of the IC package formed into an alloy and stuck to the probe pin after a high-temperature test was compared between a conventional probe pin (i.e., a probe pin provided with a second plunger including a surface layer composed of a Pd—Ag plated layer on the outermost side of the probe pin) and a probe pin of this Embodiment 2 (i.e., a probe pin provided with a second plunger in which an outermost layer composed primarily of Au was plated on a surface layer composed primarily of Pd and Ag).

(1) Test Contents

First, a simultaneous high-temperature test was conducted using an IC socket including the probe pin according to this Embodiment 2 and an IC socket including a conventional probe pin (i.e., a probe pin not provided with an Au plated layer serving as an outermost layer).

The specifications of the probe pins and the solder balls of IC packages used in this test were as follows:

(2) Specifications of Probe Pin Including Au Plated Layer

Brass was used as a base material.

Like the contacting portion 30*a* illustrated in FIG. 1, the contacting portion of the probe pin was formed into a substantially crown-like shape.

A laminated film was formed on a surface of this contacting portion using wet plating.

That is, an Ni plated layer having a thickness of 2 to 3 μm was first formed on a surface of the base material. Then, an Au strike-plated layer to serve as an adhesion layer was formed on the Ni plated layer. In addition, a Pd plated layer having a thickness of 0.5 μm and an Ag plated layer having a thickness of 0.5 μm were laminated in an alternate manner. Thereafter, Pd and Ag were thermally diffused at predetermined temperature using a thermostatic chamber. The weight ratio between Pd and Ag at this time was Pd:Ag=54:46. Yet additionally, an Au plated layer having a thickness of 0.1 μm was formed on the layer stack by a wet plating method.

(3) Specifications of Probe Pin not Including Au Plated Layer

Brass was used as a base material.

Like the contacting portion 30*a* illustrated in FIG. 1, the contacting portion of the probe pin was formed into a substantially crown-like shape.

A laminated film was formed on a surface of this contacting portion using wet plating.

That is, an Ni plated layer having a thickness of 2 to 3 μm was first formed on a surface of the base material. Then, an Au strike-plated layer to serve as an adhesion layer was formed on the Ni plated layer. In addition, a Pd plated layer having a thickness of 0.5 μm and an Ag plated layer having a thickness of 0.5 μm were laminated in an alternate manner. Thereafter, Pd and Ag were thermally diffused at predetermined temperature using a thermostatic chamber. The weight ratio between Pd and Ag at this time was Pd:Ag=54:46.

(4) Specifications of Solder Balls of IC Package

Sn-3Ag-0.5Cu (percent by mass) lead-free solder was used as a material for forming the solder balls.

(5) Test Method

Method for measuring the amount of deposited solder: A shape measurement was conducted using a shape-measuring laser microscope (VK-9500 made by Keyence Corporation).

Test Conditions were as follows:

Ambient temperature: Room temperature to 125° C.

Test time: 24 hours

A test procedure was as follows:

a. Attach the IC package to the IC socket.

b. Raise the temperature of the IC socket and the IC package up to 125° C.

c. Keep the temperature of the IC socket and the IC package at 125° C. for 24 hours.

d. Lower the temperature of the IC socket and the IC package down to room temperature.

e. Detach the IC package from the IC socket.

f. Measure the amount of solder deposited on the contacting portion of the probe pin.

(6) Test Results

The above-described test was conducted to analyze the contacting portion of each probe pin.

Figure 7A:
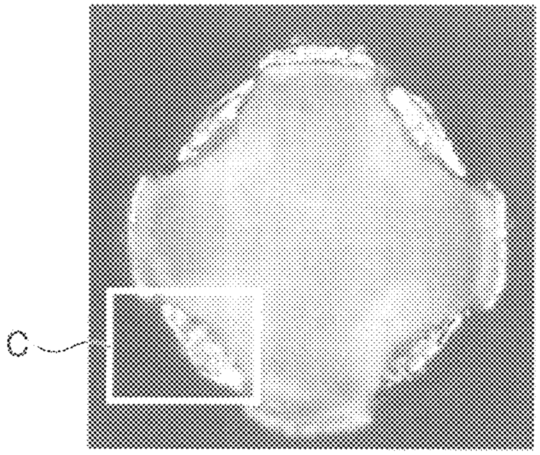
FIG. 7A is a photograph showing a state of the contacting portion of the probe pin according to Embodiment 1 after a high-temperature test.
Figure 7B:
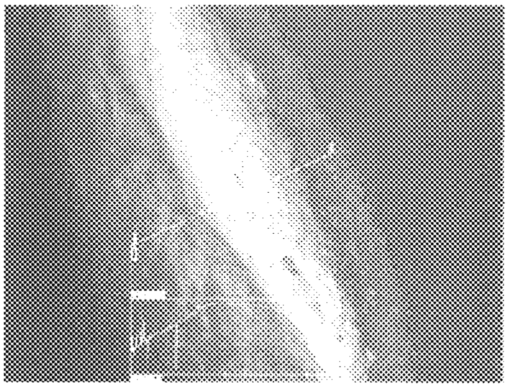
FIG. 7B is a partially-enlarged photograph of FIG. 7A.
Figure 7C:
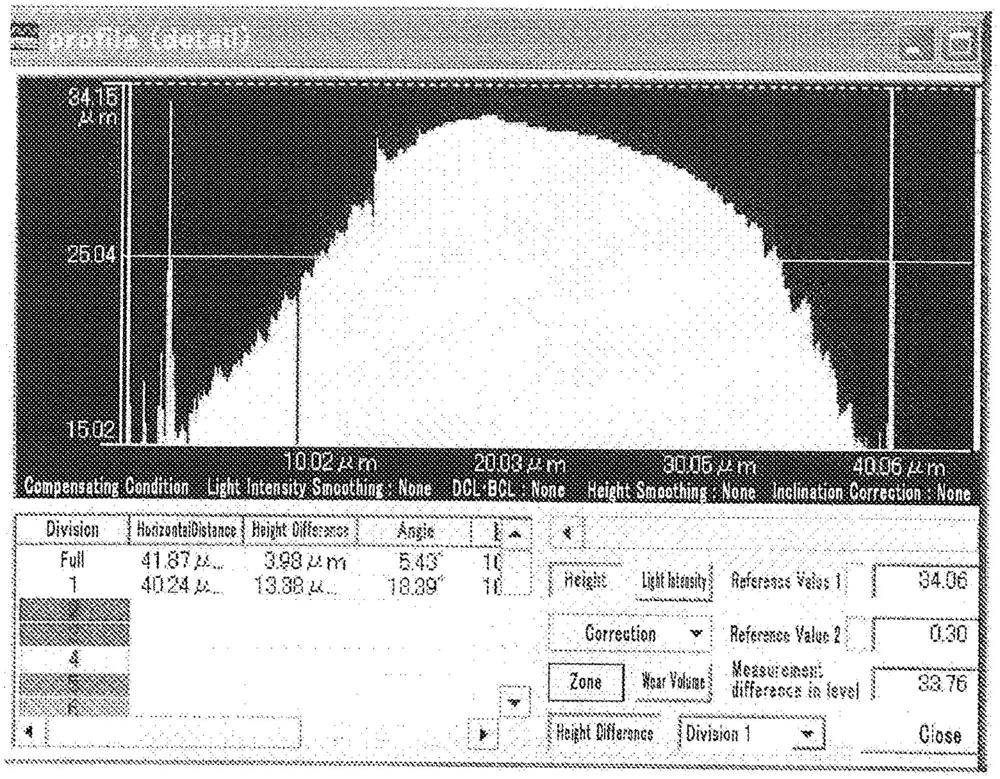
FIG. 7C is a photograph of a graph showing the result of measuring a cross-sectional shape corresponding to FIG. 7B.

FIG. 7A is a photograph showing a state of the probe pin including an Au plated layer after the evaluation test. In FIG. 7A, white areas represent Sn that separated from the solder balls of the IC package and stuck to the surface of the probe pin. FIG. 7B is a partially-enlarged photograph of the region shown by reference character C in FIG. 7A. FIG. 7C is a photograph showing the result of measuring the stuck Sn using the shape-measuring laser microscope, where the axis of abscissas represents the position, whereas the axis of ordinates represents the thickness.

Figure 8A:
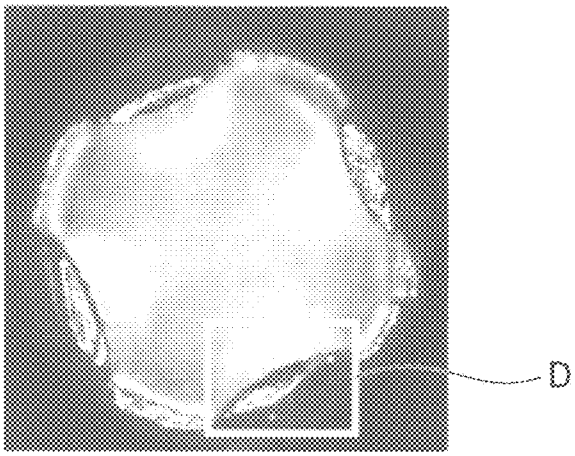
FIG. 8A is a photograph showing a state of the contacting portion of a probe pin according to a comparative example of Embodiment 1 after a high-temperature test.
Figure 8B:
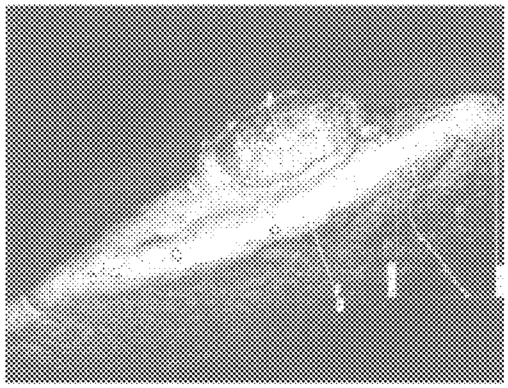
FIG. 8B is a partially-enlarged photograph of FIG. 8A.
Figure 8C:
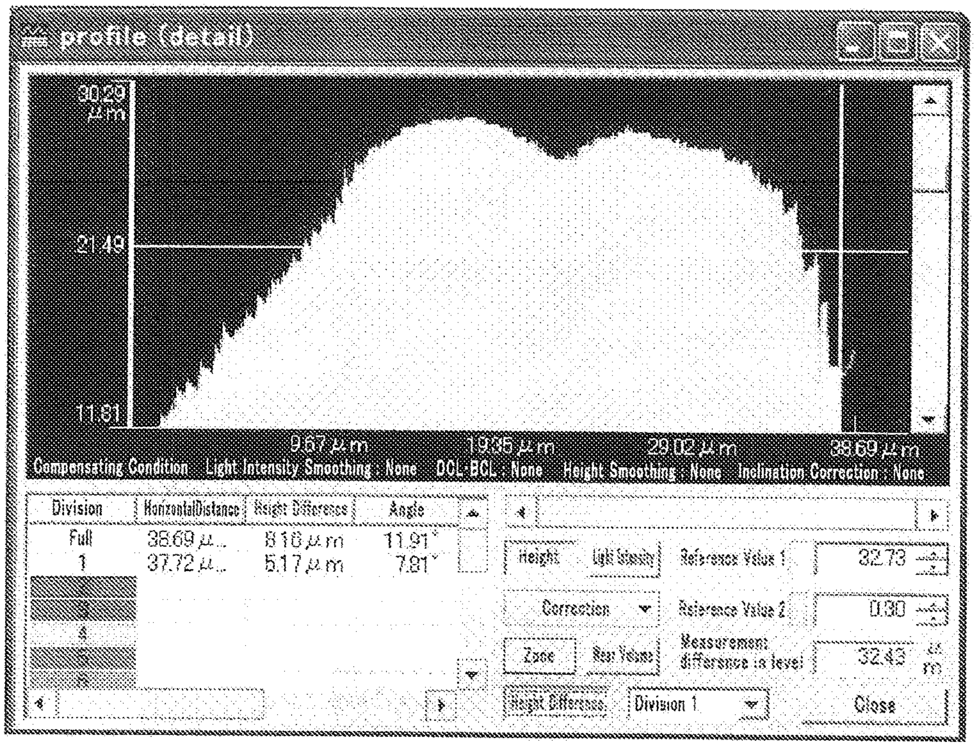
FIG. 8C is a photograph of a graph showing the result of measuring a cross-sectional shape corresponding to FIG. 8B.

FIG. 8A is a photograph showing a state of the probe pin not including an Sn plated layer after the evaluation test. In FIG. 8A, white areas represent Sn that separated from the solder balls of the IC package and stuck to the surface of the probe pin. FIG. 8B is a partially-enlarged photograph of the region shown by reference character D in FIG. 8A. FIG. 8C is a photograph showing the result of measuring the stuck Sn using the shape-measuring laser microscope, where the axis of abscissas represents the position, whereas the axis of ordinates represents the thickness.

As is understood from FIGS. 7A to 7C, the amount of solder sticking after the test is small in the probe pin according to this Embodiment 2 (i.e., a probe pin on which an Au plated layer serving as an outermost layer is formed). Consequently, it can be said that the solder ball and the probe pin are less likely to stick to each other. In contrast, as is understood from FIGS. 8A to 8C, the amount of solder sticking after the test is large in the conventional probe pin (a probe pin on which an Au plated layer is not formed), compared with the probe pin according to this Embodiment 2. Consequently, it can be said that the solder ball and the probe pin are more likely to stick to each other in the conventional probe pin.

FIGS. 9 to 14 respectively illustrate different modified examples of Embodiments 1 and 2 of the present invention. Note that the configurations of these modified examples are the same as those of Embodiments 1 and 2 described above, except the differences of materials to be described hereafter.

Figure 9:
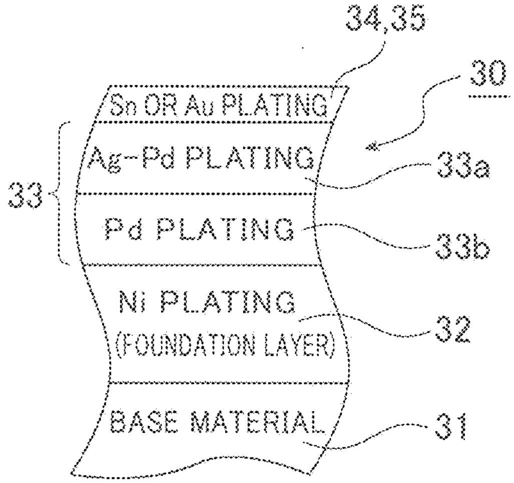
FIG. 9 is a schematic cross-sectional view illustrating the laminar structure of the contacting portion of a probe pin according to a modified example of the present invention.
Figure 10:
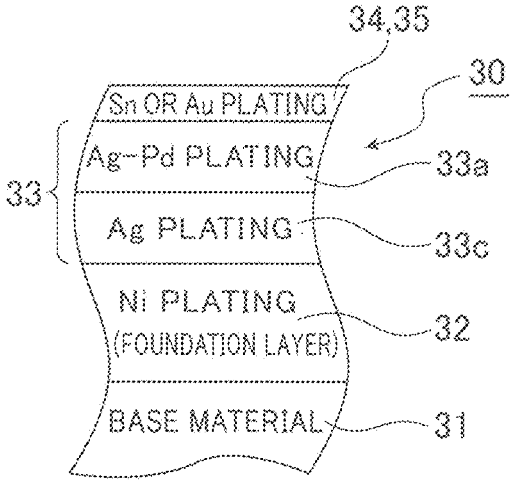
FIG. 10 is a schematic cross-sectional view illustrating the laminar structure of the contacting portion of a probe pin according to a modified example of the present invention.
Figure 11:
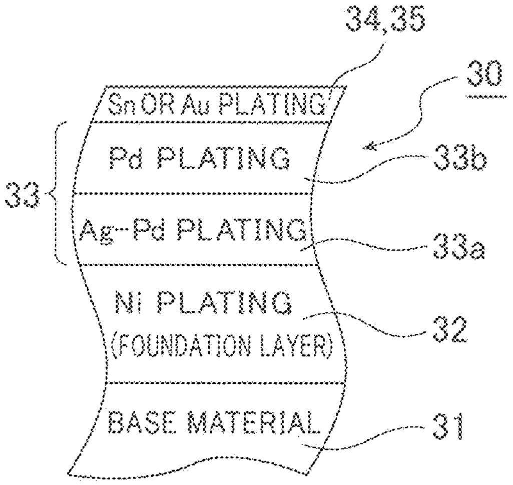
FIG. 11 is a schematic cross-sectional view illustrating the laminar structure of the contacting portion of a probe pin according to a modified example of the present invention.
Figure 12:
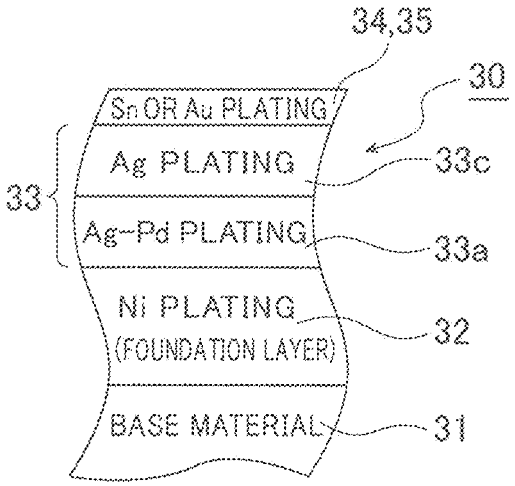
FIG. 12 is a schematic cross-sectional view illustrating the laminar structure of the contacting portion of a probe pin according to a modified example of the present invention.
Figure 13:
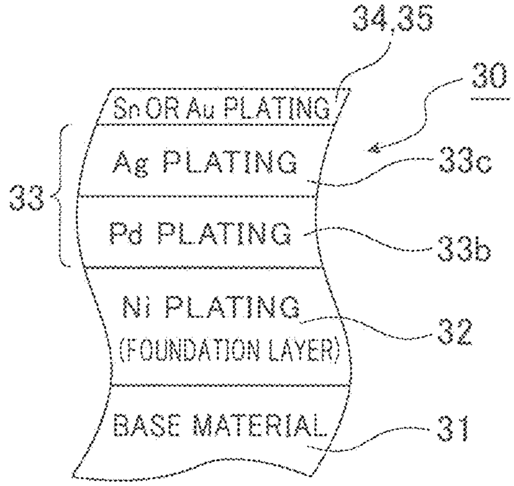
FIG. 13 is a schematic cross-sectional view illustrating the laminar structure of the contacting portion of a probe pin according to a modified example of the present invention.
Figure 14:
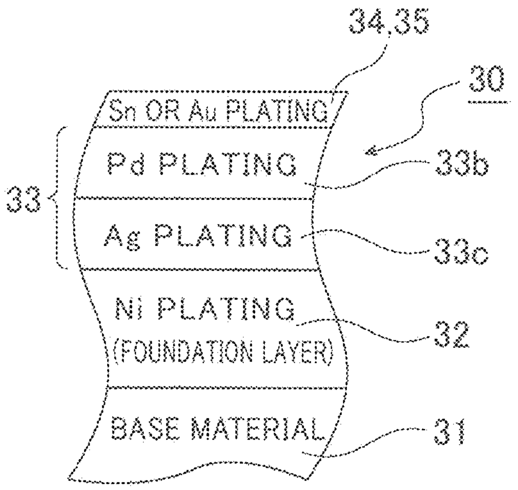
FIG. 14 is a schematic cross-sectional view illustrating the laminar structure of the contacting portion of a probe pin according to a modified example of the present invention.

In the second plunger 30 of the probe pin illustrated in FIG. 9, a Pd plated layer 33*b* is formed between the Pd—Ag plated layer 33*a* and the foundation layer 32. In the second plunger 30 of the probe pin 14 illustrated in FIG. 10, an Ag plated layer 33*c* is formed between the Pd—Ag plated layer 33*a* and the foundation layer 32. In the second plunger 30 of the probe pin 14 illustrated in FIG. 11, a Pd plated layer 33*b* is formed on the Pd—Ag plated layer 33*a*. In the second plunger 30 of the probe pin 14 illustrated in FIG. 12, an Ag plated layer 33*c* is formed on the Pd—Ag plated layer 33*a*. In the second plunger 30 of the probe pin 14 illustrated in FIG. 13, a Pd plated layer 33*b* and an Ag plated layer 33*c* are laminated in order on the foundation layer 32. In the second plunger 30 of the probe pin 14 illustrated in FIG. 14, the Ag plated layer 33*c* and the Pd plated layer 33*b* are laminated in order on the foundation layer 32.

These probe pins illustrated in FIGS. 9 to 14 can also prevent the solder ball and the second plunger 30 from sticking to each other after a continuity test and thereby improve the durability of the probe pin and the IC socket, since the probe pins are provided with the outermost layer 34 composed primarily of Sn or the outermost layer 35 composed primarily of Au.

The present invention is also applicable to a probe pin including a surface layer 33 formed from other materials.

For example, the surface layer 33 illustrated in FIG. 3 may be an Ag—Sn (10% by weight of Ag) plated layer having a thickness of approximately 1 μm. At this time, Ag is preferably 80% or higher in the weight ratio between Ag and Sn.

Alternatively, the surface layer 33 illustrated in FIG. 3 may be formed from a composite material composed of Ag and an oxide of a metal element. For example, the surface layer 33 may be composed primarily of Ag and ZnO (zinc oxide). The weight ratio between Ag and ZnO may be, for example, 89.7:10.3, and thus the ratio of Ag is preferably 80% or higher.

As the composite material composed of Ag and an oxide of a metal element, it is possible to adopt an Ag—SnO2 (tin dioxide) material, in addition to the Ag—ZnO material.

As an example of the composite material other than a material composed of Ag and a metal, it is possible to adopt, for example, an Ag—C (carbon) material. The weight ratio between Ag and C may be, for example, 99:1, and thus the ratio of Ag is preferably 80% or higher.

In Embodiments 1 and 2 described above, discussions have been made on the material of the second plunger 30 of the probe pin 14. Other portions of the probe pin 14 may be composed of the same material, however.

Also in Embodiments 1 and 2 described above, probe pins which are "electric contacts" have been applied to an IC socket. Without limitation to this application, however, the probe pins may be applied to other devices.

DESCRIPTION OF REFERENCE CHARACTERS

1: Wiring board
1*a*: Electrode
2: IC package (electrical part)
2*a*: Solder ball (terminal)
10: IC socket (socket for electrical part)
13: Socket body
14: Probe pin (electric contact)
15: Floating plate (housing portion)
20: First plunger
30: Second plunger
30*a*: Contacting portion
31: Base material
32: Foundation layer
33: Surface layer
33*a*: Pd—Ag plated layer
33*b*: Pd plated layer
33*c*: Ag plated layer
34: Outermost layer (Sn)
35: Outermost layer (Au)
40: Cylindrical member
50: Coil spring

The invention claimed is:

1. An electric contact comprising:

an electrically-conductive base material;

a surface layer which comprises Pd and Ag, and is formed above the base material;

an outermost layer which comprises Sn and is directly formed on the surface layer; and a barrier layer formed by melting of a specific amount of Sn in the outermost layer into the surface layer, wherein the electric contact is in contact with an Sn-containing terminal of an electrical part when a continuity test of the electrical part is conducted in a high temperature environment under which Sn contained in the Sn-containing terminal of the electrical part melts, and the barrier layer suppresses Sn contained in the Sn-containing terminal of the electrical part melted under the high temperature environment of the continuity test from being alloyed with Pd and Ag contained in the surface layer.

2. The electric contact according to claim 1, wherein the Ag is included in the surface layer at a percent weight ratio higher than that of the Pd.

3. The electric contact according to claim 1, wherein the surface layer includes a Pd—Ag plated layer.

4. The electric contact according to claim 1, wherein the surface layer includes a laminate of a Pd—Ag plated layer and an Ag plated layer or a laminate of a Pd—Ag plated layer and a Pd plated layer.

5. The electric contact according to claim 1, wherein the surface layer includes a laminate of an Ag plated layer and a Pd plated layer.

6. The electric contact according to claim 1, wherein a foundation layer comprising Ni is formed on the base material, and the surface layer is formed on the foundation layer.

7. A socket for electrical part comprising:

a socket body;

a housing portion in which an electrical part provided with an Sn-containing terminal is housed when a continuity test of the electrical part is conducted in a high temperature environment under which Sn contained in the Sn-containing terminal of the electrical part melts; and an electric contact disposed in the socket body and in contact with the terminal, wherein the electric contact comprises:

an electrically-conductive base material;

a surface layer which comprises Pd and Ag, and is formed above the base material;

an outermost layer which comprises Sn, and is directly formed on the surface layer; and a barrier layer formed by melting of a specific amount of Sn in the outermost layer into the surface layer, and the barrier layer suppresses Sn contained in the Sn-containing terminal of the electrical part melted under the high temperature environment of the continuity test from being alloyed with Pd and Ag contained in the surface layer.

8. An electric contact comprising:

an electrically-conductive base material;

a surface layer which comprises Pd and Ag, and is formed above the base material; and an outermost layer which comprises Au and is directly formed on the surface layer, wherein the electric contact is in contact with an Sn-containing terminal of an electrical part when a continuity test of the electrical part is conducted in a high temperature environment under which Sn contained in the Sn-containing terminal of the electrical part melts, and when the outermost layer is directly contacted with the Sn-containing terminal of the electrical part and the electrical part is operated in the high temperature environment, at least a part of Sn contained in the Sn-containing terminal is melted, which thereby forms an Sn—Au alloy, which is easier to delaminate than an alloy of Pd—Ag contained in the surface layer and Sn contained in the Sn-containing terminal of the electrical part, between the outermost layer and the Sn-containing terminal.

9. The electric contact according to claim 8, wherein the Ag is included in the surface layer at a percent weight ratio higher than that of the Pd.

10. The electric contact according to claim 8, wherein the surface layer includes a Pd—Ag plated layer.

11. The electric contact according to claim 8, wherein the surface layer includes a laminate of a Pd—Ag plated layer and an Ag plated layer or a laminate of a Pd—Ag plated layer and a Pd plated layer.

12. The electric contact according to claim 8, wherein the surface layer includes a laminate of an Ag plated layer and a Pd plated layer.

13. The electric contact according to any one of claim 8, wherein a foundation layer comprising Ni is formed on the base material, and the surface layer is formed on the foundation layer.

14. A socket for electrical part comprising:

a socket body;

a housing portion in which an electrical part provided with an Sn-containing terminal is housed when a continuity test of the electrical part is conducted in a high temperature environment under which Sn contained in the Sn-containing terminal of the electrical part melts; and an electric contact disposed in the socket body and in contact with the terminal, wherein the electric contact comprises:

an electrically-conductive base material;

a surface layer which comprises Pd and Ag, and is formed above the base material; and an outermost layer which comprises Au and is directly formed on the surface layer, and wherein when the outermost layer is directly contacted with the Sn-containing terminal of the electrical part and the electrical part is operated in the high temperature environment, at least a part of Sn contained in the Sn-containing terminal is melted, which thereby forms an Sn—Au alloy, which is easier to delaminate than an alloy of Pd—Ag contained in the surface layer and Sn contained in the Sn-containing terminal of the electrical part, between the outermost layer and the Sn-containing terminal.

* * * * *